United States Patent

[11] 3,626,081

[72] Inventor Richard L. Little
Minneapolis, Minn.

[21] Appl. No. 887,208

[22] Filed Dec. 22, 1969

[45] Patented Dec. 7, 1971

[73] Assignee Comcet Incorporated
St. Paul, Minn.

[54] SANDWICH-TYPE VOLTAGE AND GROUND PLANE
12 Claims, 3 Drawing Figs.

[52] U.S. Cl. .......................................................... 174/68.5, 29/625, 29/626, 156/3, 317/101 CC

[51] Int. Cl. .......................................................... H05k 1/04

[50] Field of Search ............................................174/68.5; - 29/625–627; 333/84 M; 339/18 B, 18 C, 19, 17; 317/101 B, 101 C, 101 CM, 101 CC, 101 D; 156/3

[56] References Cited

UNITED STATES PATENTS

| | | | |
|---|---|---|---|
| 3,042,740 | 7/1962 | Bosworth ..................... | 174/68.5 |
| 3,061,760 | 10/1962 | Ezzo............................ | 317/100 |
| 3,197,766 | 7/1965 | Stein et al. .................... | 317/101 D X |

*Primary Examiner*—Darrell L. Clay
*Attorney*—Alfred E. Hall

ABSTRACT: A unitary sandwich-type ground and voltage plane consisting of a first and second layer of conductive material separated by an insulator and having therein a plurality of spaced apertures in a pattern to conform to the spacing of connector terminals and having etched patterns on said first and second layers for enabling electrical connections to be made between appropriate terminals and the first and second conductive layers.

PATENTED DEC 7 1971 3,626,081

INVENTOR.
RICHARD L. LITTLE
BY Alfred E Hall
ATTORNEY

SANDWICH-TYPE VOLTAGE AND GROUND PLANE

BACKGROUND OF THE INVENTION

The prior art methods of forming voltage and ground planes are of two known types.

The first method requires the use of individual layers of conductive planes and insulating layers. Thus, a first conductive plane would be placed over the terminals on the baseplate assembly and proper terminals would be soldered thereto. Next an insulating layer would be placed over the terminals and the second conductive plane would be placed on top of the insulating layer. Appropriate terminals would be soldered to the second conductive layer.

The disadvantages of this method are (1) the time required to handle three separate planes, (2) the necessity of soldering connections of two separate planes, and (3) the extra thickness of three layers that are not integrally formed which does not allow as high capacitance as can be obtained with the present method.

The second method utilized a lamination process to form the two conductive planes separated by an insulating layer. This method of forming the voltage-ground plane is very expensive because each layer has holes stamped therein prior to lamination which is costly and which requires hole alignment before lamination.

SUMMARY

The present invention relates to a unitary sandwich-type ground and voltage plane for extremely low impedance and high frequency filtering.

The sandwich-type plane consists of a first and second layer of conductive material separated by an insulator. A plurality of spaced apertures through the three layers are provided in a pattern to conform to the connector baseplate terminal spacing.

Large areas of one conductive layer are etched away on each side of the plane to enable the voltage or ground bus to be attached thereto.

Where individual terminals are not to be attached to either the voltage or ground plane, the conductive layers around the aperture on both planes is etched away.

Where an individual terminal is to be attached to the top plane, the bottom conductive layer around the aperture is etched away allowing soldering to take place on the upper plane only.

Where an individual terminal is to be attached to the bottom plane, the top conductive layer around the aperture is etched so as to leave a small conductive area immediately adjacent the aperture which is electrically isolated from the remainder of the top conductive plane. When the terminal is soldered to this small area, the solder flows from the area to the terminal and down the terminal to the bottom conductive layer where the desired connection occurs. Thus, by leaving the small electrically isolated area immediately adjacent the aperture, soldering can take place on top of the plane to make a connection on the lower plane.

Also, if soldering terminals on the edges of the assembly have a tendency to cause the plane to buckle or bow in the center, certain areas can be prepared such that they can be soldered to holddown pins. Thus, the bottom conductive layer immediately adjacent the aperture is completely removed through etching while the top conductive layer around the aperture is etched so as to leave a small conductive area immediately adjacent the aperture which is electrically isolated from the remainder of the top conductive plane. A holddown pin can then be soldered to this isolated area which will not make electrical connection but which will prevent the plane from buckling in the center.

Thus, it is an object of the present invention to provide a unitary sandwich-type ground and voltage plane having extremely low impedance and high frequency filtering.

It is a further object of the present invention to provide a unitary sandwich-type ground and voltage plane consisting of first and second layers of conductive material separated by an insulator and having therein a plurality of spaced apertures in a pattern to conform to the spacing of connector terminals and having etched patterns on said first and second conductive layers for enabling electrical connections to be between appropriate terminals and said first and second conductive layers.

It is still another object of the present invention to enable solder connections to be made on the lower conductive plane while the actual soldering takes place on the upper conductive plane by etching the upper conductive plane so as to leave a small conductive area immediately adjacent the aperture through which the terminal to be soldered will extend and which area is electrically isolated from the remainder of the upper conductive plane whereby soldering the terminal to the small electrically isolated conductive area will cause solder to flow down the terminal to the bottom conductive layer where the desired connection occurs.

It is yet another object of the present invention to provide means for preventing said unitary sandwich-type voltage and ground plane from buckling or bowing.

BRIEF DESCRIPTION OF THE DRAWINGS

These and other more detailed and specific objectives will be disclosed in the course of the following specification reference being made to the accompanying drawings in which.

DESCRIPTION OF THE PREFERRED EMBODIMENT

The voltage and ground plane of the present invention is of the sandwich type having a unitary construction. The unit consists of first and second conductive layers of material such as copper and a thickness, for example, of 2 mils (0.002 in.) separated by an insulator such as epoxy glass, fire retardant, having a thickness, for example, of 10 mils (0.010 in.). The conductive layers and the insulation layer are formed into a unitary element by a well-known lamination process utilizing heat which will not be discussed here.

Figure 1:
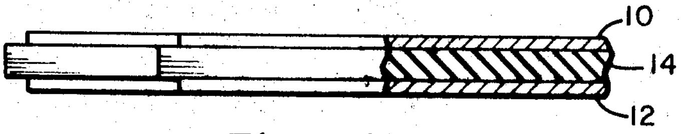
FIG. 1 is a cross-sectional view of the inventive unitary sandwich-type voltage and ground plane.

FIG. 1 is a cross-sectional view of the inventive unitary sandwich-type voltage and ground plane and comprises first conductive plane 10 and second conductive plane 12 both of which are formed of electrically conductive material such as copper and are separated by an insulator 14 which can be of a type such as flame-retardant epoxy glass as mentioned before. The thickness of the completed integrally formed unit is approximately 14 mils (0.014 in.).

Figure 2:
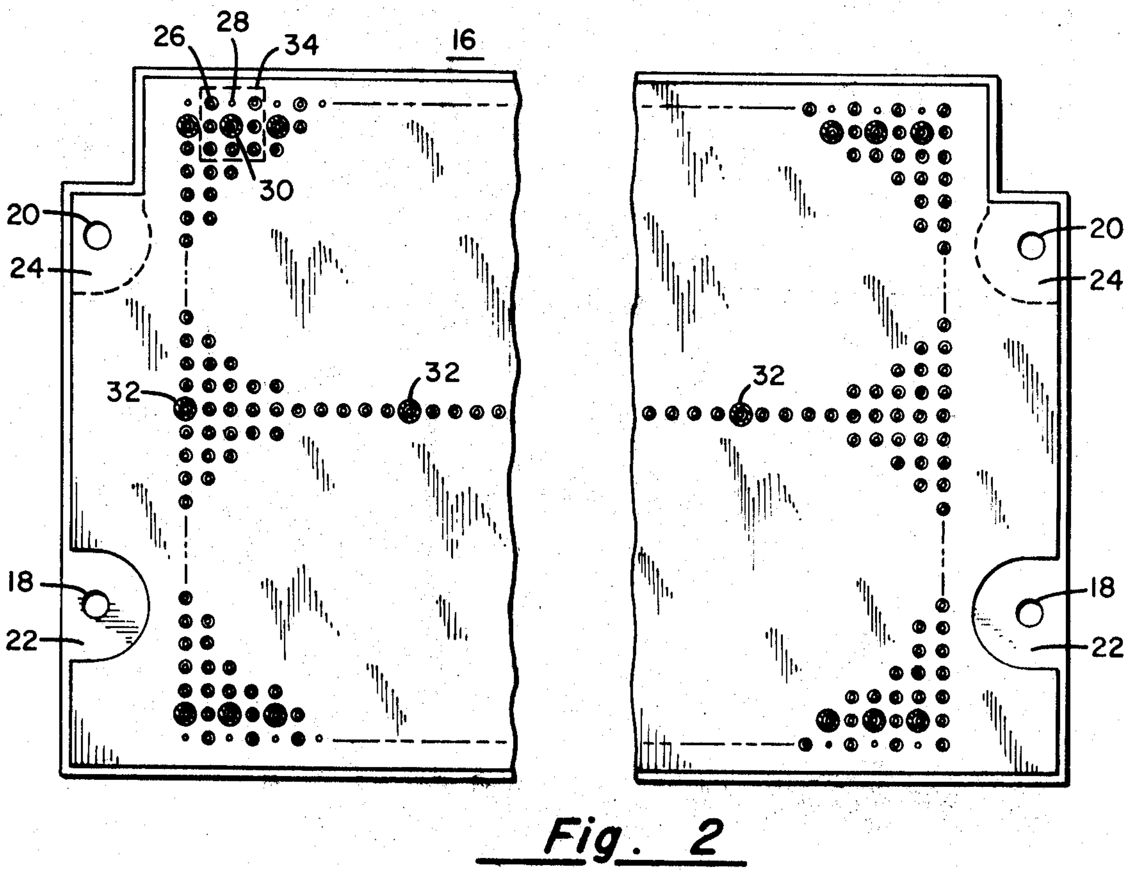
FIG. 2 is a plan view of the inventive unitary sandwich-type voltage and ground plane showing the general arrangement of the various types of apertures.

This unit can now have apertures formed therein in any convenient manner such as drilling or punching to form any desired pattern an example of which is shown in FIG. 2. Not only is the general pattern or arrangement of holes shown in FIG. 2, but the various types of apertures are shown.

The entire voltage and ground plane unit is generally designated by the numeral 16 and on each end thereof are apertures 18 and 20 which are provided to enable the connection of the voltage and ground bus thereto. It will be noted that an area 22 is provided immediately adjacent apertures 18 wherein the conductive material has been removed in any convenient manner such as, for example, by a well-known etching process. Thus when either a voltage or ground terminal is attached to the unit by any well-known means such as, for example, by a bolt passing through the terminal and aperture 18, either the terminal or the bolt, not shown, is of such a size as to fit within the etched area 22 avoiding the upper conductive layer and will, therefore, make contact with the lower conductive layer only through the fastening bolt, or the terminal depending upon which is in contact with the lower conductive layer.

In like manner, when the other terminal, not shown, is attached to the unit by any well-known means such as, for example, by a bolt passing through the terminal and aperture 20, either the bus or the bolt, not shown, is of such a size as to fit within the etched area 24 on the lower conductive layer and will, therefore, avoid electrical contact with the lower conductive layer but will make solid electrical contact with the upper conductive layer through the fastening bolt or terminal depending upon which is in contact with said upper conductive plane.

The aperture pattern shown in FIG. 2 is arbitrary and shown as an example only. However, each of the apertures will be aligned with a terminal or holddown pin which forms a part of the connector base plate assembly, not shown. The novel voltage and ground plane then mates with the terminals or holddown pins and allows the terminals or holddown pins to protrude through the apertures whereby necessary connections such as wire wrap connections can be made thereto. Now connections can also be made between the voltage and ground planes to the appropriate terminals.

The apertures through which appropriate terminals protrude and to which various connections are made are shown generally in FIG. 2.

Aperture 26 is the general type through which the terminals protrude that are to make no connection to either the voltage or ground plane. All conductive material on both the voltage and ground planes immediately adjacent the aperture is removed so no connection can be made between the terminal and the conductive planes.

Aperture 28 is the type which allows connection between any terminal protruding therethrough and the upper conductive plane. It is simply an aperture drilled through all three layers of material but which has the conductive material only on the lower conductive plane immediately adjacent the aperture removed to prevent connection between that plane and the terminal.

Aperture 30 is the type which allows connections to be made between the lower conductive plane and the terminal protruding through the aperture by soldering on the upper plane and allowing the solder to run down the terminal to the lower conductive plane and adhere thereto. This aperture has a small conductive area immediately adjacent the aperture on the upper conductive plane which is electrically isolated from the remainder of the plane but which can be connected as by soldering to the terminal. Solder flow from the upper plane to the lower conductive plane is further assured by the fact that the aperture 30 is a "plated-through" hole. "Plated-through" is the terminology applied to a common printed circuit process utilizing electrodeposition which will not be discussed here.

If both the upper and lower conductive layers have an aperture 30 in alignment with each other, a holddown pin can be inserted therethrough and soldered to the planes without electrical connection but which will serve to prevent the plane from buckling or bowing. In like manner, if aperture 30 is present on the upper plane, the conductive material on the lower plane immediately adjacent that aperture can be removed entirely to prevent electrical connection and the holddown pin soldered to the electrically isolated small conductive area on the upper plane immediately adjacent the aperture. Such apertures are shown by the numeral 32 in FIG. 2.

Figure 3:
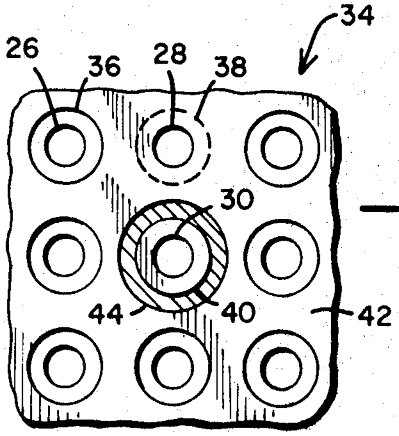
FIG. 3 discloses the details of the various types of apertures including the areas immediately adjacent the apertures wherein conductive material may or may not have been removed.

The apertures shown in area 34 in FIG. 2 are shown in detail in FIG. 3. Like numerals are used in FIG. 3 to show like apertures.

Again, aperture 26 is the general type through which the connector terminals protrude that are to make no connection to either the voltage or ground plane. All conductive material on both the voltage and ground planes in the area 36 immediately adjacent the aperture 26 is removed so no connection can be made between the terminal and the conductive planes.

Aperture 28 is the type which allows connection between any terminal protruding therethrough and the upper conductive plane. It is simply an aperture drilled through all three layers of material but which has the conductive material only on the lower conductive plane in the area 38, shown in dashed lines, immediately adjacent the aperture removed to prevent connection between that plane and the terminal.

Aperture 30 has a small conductive area 40 immediately adjacent thereto that is electrically isolated from the remainder of the conductive plane 42 by an area 44 wherein the conductive material has been etched away. If aperture 30, on the lower conductive layer, is constructed as aperture 28, then it is obvious that any terminal protruding through aperture 30 can be soldered to the small conductive area 40 and the solder will run down the terminal, not shown, and make connection with the lower conductive layer only.

In like manner, if aperture 30 is constructed on the lower conductive plane in the same manner as it is on the upper conductive plane or if the conductive material immediately adjacent the aperture on the lower conductive plane only is etched away or otherwise removed, then it is obvious that terminals can be attached thereto as holddown pins since they will not be able to make electrical connection with either conductive plane.

Thus the present invention enables a sandwich-type voltage and ground plane to be produced economically because it utilizes printed circuit techniques and yet which provides extremely low impedance and high frequency filtering because of the sandwich-type construction.

It is understood that suitable modifications may be made in the structure as disclosed provided such modifications come within the spirit and scope of the appended claims.

Having now, therefore, fully illustrated and described my invention, what I claim to be new and desire to protect by Letters Patent is:

1. A unitary sandwich-type voltage and ground plan to be used with a connector block assembly having terminals thereon comprising:
   a. upper and lower layers of conductive material integrally formed with and separated by an insulator,
   b. a plurality of apertures extending through said upper and lower conductive layers and said insulator, said apertures having a pattern conforming to the spacing of and receiving the connector block assembly terminals, and
   c. etched patterns on said upper and lower layers of conductive material of such configurations as to enable soldered electrical connections to be selectively made between appropriate terminals inserted in said apertures and either of said upper and lower conductive layers from said upper layer of said plane.

2. A unitary sandwich-type voltage and ground plane as in claim 1 wherein said etched pattern comprises;
   a. a nonconductive area on one of said layers immediately adjacent at least one aperture and extending to at least one edge of said plane whereby the appropriate electrical voltage may be applied only to the opposite conductive layer through one of said terminals inserted in said aperture.

3. A unitary sandwich-type voltage and ground plane as in claim 1 where said etched pattern comprises:
   a. a nonconductive area immediately adjacent predetermined corresponding apertures on both layers to prevent electrical connection between said layers and terminals inserted in said apertures.

4. A unitary sandwich-type voltage and ground plane as in claim 1 wherein said etched pattern comprises:
   a. nonconductive areas immediately adjacent predetermined apertures on said bottom layer to prevent solder, which follows any said terminal inserted in said predetermined apertures, from making connection with said lower layer when a solder connection is made between said terminal and said upper layer.

5. A unitary sandwich-type voltage and ground plane as in claim 1 wherein said etched pattern comprises:

a. nonconductive areas surrounding predetermined apertures on said top layer such that an electrically isolated conductive layer exists immediately adjacent said predetermined apertures whereby soldering can take place on said top layer to form soldered electrical connections only on said bottom layer.

6. A unitary sandwich-type voltage and ground plane as in claim 1 wherein said etched pattern comprises:

a. nonconductive areas surrounding predetermined apertures on said bottom layer to prevent electrical connection between said bottom layer and terminals inserted in said apertures and b. nonconductive areas surrounding corresponding apertures on said top layer leaving an electrically isolated conductive area immediately adjacent each of said corresponding apertures whereby holddown terminals can be soldered to said isolated areas to prevent buckling of said plane.

7. A method of forming a sandwich-type voltage and ground plane from a unitary plane having upper and lower conductive layers separated by an insulator comprising the steps of:

a. cutting said unitary plane to the desired size;

b. forming apertures in said plane in a predetermined pattern;

c. etching away predetermined areas on said upper and lower layers of conductive material to prevent solder from adhering thereto, and d. soldering all electrical connections between selected ones of said upper and lower layers and appropriate terminals inserted in said apertures from one side of said plane.

8. A method as in claim 7 wherein the step of etching away predetermined areas on said first and second conductive layers further includes:

a. etching away sufficient areas of one conductive layer immediately adjacent apertures receiving voltage and ground terminals to enable said voltage and ground terminals to be electrically connected only to the opposite conductive layer.

9. A method as in claim 7 wherein the step of etching away predetermined areas on said first and second conductive layers further includes:

a. etching away conductive areas surrounding predetermined corresponding apertures on both layers to prevent electrical connection between either of said layers and terminals inserted in said apertures.

10. A method as in claim 7 wherein the step of etching away predetermined areas on said first and second conductive layers further includes:

a. etching away conductive areas surrounding predetermined apertures on one of said layers whereby terminals inserted in said apertures can be electrically connected to the other layer only.

11. A method as in claim 7 wherein the step of etching away predetermined areas on said first and second conductive layers further includes:

a. etching away conductive areas surrounding predetermined apertures only on said upper layer and leaving a small electrically isolated conductive layer immediately adjacent said predetermined apertures whereby soldering can take place on said upper layer to make connections between terminals inserted in said apertures and said lower conductive layer only.

12. A method as in claim 7 wherein the step of etching away predetermined areas on said first and second conductive layers further includes:

a. etching away conductive areas immediately surrounding predetermined apertures on said lower layer to prevent electrical connection between said lower layer and terminals inserted in said predetermined apertures and b. etching away conductive areas surrounding corresponding apertures on said upper layer leaving an electrically isolated conductive area immediately adjacent said corresponding apertures whereby holddown pins can be soldered to said isolated areas to prevent buckling of said plane.

* * * * *